(12) United States Patent
Carlson et al.

(10) Patent No.: US 8,217,512 B1
(45) Date of Patent: Jul. 10, 2012

(54) THERMAL INTERFACE DEVICE

(75) Inventors: Gary Carlson, Aliso Viejo, CA (US); Frank Landon, Santa Ana, CA (US); Jeffrey Chen, Irvine, CA (US); Mark Minot, Aliso Viejo, CA (US); Joseph Talbert, Murrieta, CA (US)

(73) Assignee: EADS North America, Inc., Irvine, CA (US)

( * ) Notice: Subject to any disclaimer, the term of this patent is extended or adjusted under 35 U.S.C. 154(b) by 1081 days.

(21) Appl. No.: 11/526,327

(22) Filed: Sep. 25, 2006

Related U.S. Application Data

(60) Provisional application No. 60/807,339, filed on Jul. 13, 2006.

(51) Int. Cl.
*H01L 23/34* (2006.01)

(52) U.S. Cl. ......... 257/720; 257/687; 257/705; 257/712

(58) Field of Classification Search ............. 165/104.16, 165/104.26, 185
See application file for complete search history.

(56) References Cited

U.S. PATENT DOCUMENTS 6,987,671 B2 * 1/2006 Houle .......................... 361/704

* cited by examiner

*Primary Examiner* — Zandra Smith
*Assistant Examiner* — Pamela E Perkins

(57) ABSTRACT

A thermal interface device (100) includes a base member (102) and a pocket (104) which is filled with a thermally conductive material or medium such as diamond dust suspended in a solvent such as propylene glycol or a thermally conductive material such as thermally conductive rubber. The pocket (104) is hermitically sealed to the base member (102) in order to keep the thermally conductive material within the pocket. The filled pocket (104) forms a deformable "pillow" having a high thermal conductance. The deformable pocket (104) can contour to the shape of a device it is pressed against such as an electronic device undergoing testing.

19 Claims, 1 Drawing Sheet

THERMAL INTERFACE DEVICE

CROSS REFERENCE TO RELATED APPLICATION

This application claims the benefit of U.S. Provisional Application No. 60/807,339, filed on Jul. 21, 2006.

FIELD OF THE INVENTION

The invention relates in general to heat dissipation devices and more particularly to a thermal interface device for use in dissipating heat from electronic devices that are undergoing testing.

BACKGROUND

Factory testing of semiconductor devices that dissipate significant heat require a means of transmitting heat from the device to the actual cooling element (e.g., an evaporator) being employed through a thermal interface medium or material (TIM) which is also referred to as a thermal interface device (TID). Typically in prior designs the TID has been implemented using a thin sheet of metal foil that is both very ductile and has a low thermal resistance (such as indium). While this type of TID works acceptably for capped semiconductor devices, it has limitations for use with bare-die devices and other situations such as where small die geometries, concentrated heat-flux, and bonding irregularities to the lead frame can contribute to insufficient surface contact and inadequate device heat conduction to the device cooler.

BRIEF DESCRIPTION OF THE DRAWINGS

The features of the present invention, which are believed to be novel, are set forth with particularity in the appended claims. The invention may best be understood by reference to the following description, taken in conjunction with the accompanying drawings, in the several figures of which like reference numerals identify like elements, and in which:

DETAILED DESCRIPTION

Figure 1:
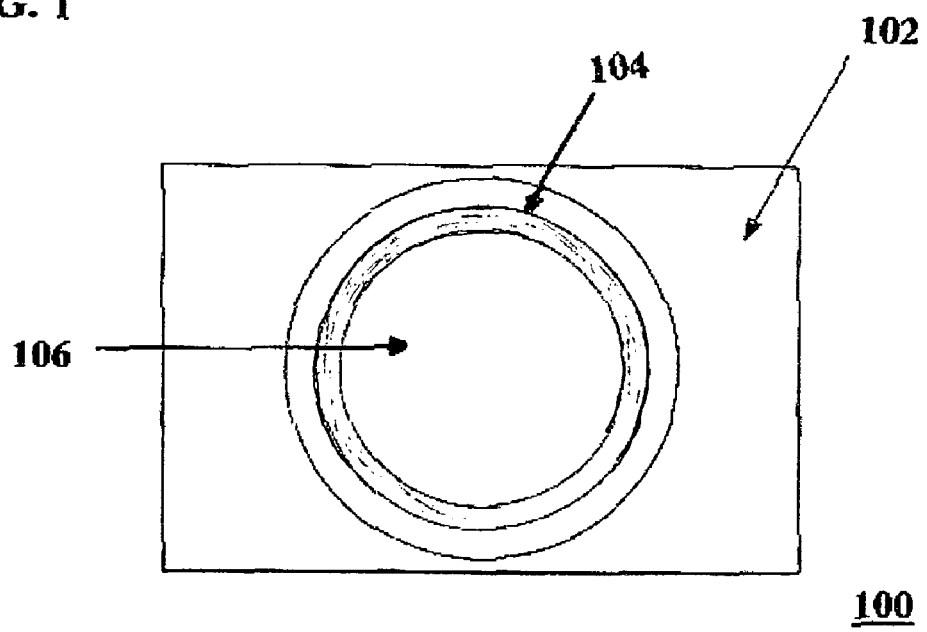
FIG. 1 shows a top view of a thermal interface device (TID) in accordance with an embodiment of the invention.

While the specification concludes with claims defining the features of the invention that are regarded as novel, it is believed that the invention will be better understood from a consideration of the following description in conjunction with the drawing figures.

One embodiment of the invention utilizes a hermetically-sealed "silver pillow" containing a suspension of nano-particle size diamond dust in a propylene glycol solvent. Unlike indium, silver has a lower thermal resistance, is much less expensive, and is much more abrasion and tear resistant than indium but lacks the comparable softness of it. The concept of a pillow using a high-conductance thermal medium comprising diamond dust in a solvent carrier addresses this limitation in accordance with one embodiment of the invention.

Referring now to FIG. 1, there is shown a top view of a TID 100 in accordance with one embodiment of the invention. The TID 100 includes a silver foil base member 102 and a deformable pocket 104 also formed from silver foil that includes a contact surface 106 which in one embodiment is used to thermally mate with a device undergoing testing (referred to as a device-under-test, DUT). Although silver foil is used in one embodiment of the invention for the base member 102 and deformable pocket member 104, other thermally conductive materials or foils can also be used. The deformable pocket or "pillow" 104 can be hermetically sealed by solder to the base 102 after the deformable pocket 104 is filed with a thermally conductive medium such as a mixture of diamond dust and solvent, other sealing methods known in the art can also be used to seal the base 102 and deformable pocket 104 together.

In one embodiment, the silver used to make the pocket 104 and base 102 members was a silver foil 3-mill thick, although other thicknesses can be used as required for a particular design. The mixture of diamond dust to propylene glycol solvent in one embodiment was three parts diamond dust to one part propylene glycol solvent, although these proportions can also be modified depending on the particular compression characteristics desired, etc. The pillow (pocket 104) included approximately 3 grams of the diamond dust and propylene glycol solvent mixture; with the pillow 104 having a substantially circular shape and a diameter of approximately 1⅛ inch. The amounts of diamond dust and solvent can be adjusted in order to control the deformation characteristics of the design as well as the thermal conductivity characteristics of the TID 100. Rubber or other compressible materials can also be added to the mixture in order to get a more compressible pocket 104 which will return back to its original shape after the TID 100 is no longer pressing against an object. Silver particles or other conductive materials can also be added to the mixture to further adjust the thermal conductive characteristics of the TID 100.

It should be noted that although propylene glycol solvent was used in one embodiment as the solvent carrier, other solvents can be used as the carrier. The nano-particle diamond dust can also be replaced with another material having low thermal resistance. Other shapes for the pocket 104 such as rectangular, square, etc. can also be used depending on the particular design requirements as well as other sizes of the pocket 104. As an example, different geometries for the pocket 104 can be designed in order to accommodate different DUT geometries. The pocket 104 can be different sizes such as larger than the die being tested. The TID 100 can preferably adapt to the die that is undergoing testing when compressed against the die even if it has a convex or concave shape. The TID 100 will allows for the quick absorption of heat that is generated from the die or electronic device that is undergoing testing.

In another embodiment of the invention, instead of using a diamond dust/solvent mixture inside of the pocket 104, a compressible thermally conductive member such as a thermally conductive rubber or elastomeric member having low thermal resistance such as available from Fujipoly America Inc. can be placed in pocket 104 and enclosed by base member 102 or partially covered with thermally conductive material such as the silver foil or other thermally conductive material. The combination of the thermally conductive rubber fully or partially covered with the thermally conductive material provides for a TID 100 which is compressible against an electronic device that is generating heat (discussed further below in more detail) such as an electronic device undergoing testing. Such a TID 100 allows for the efficient removal of heat from the heat generating device since the heat is spread out by the compressible TID 100.

Figure 2:
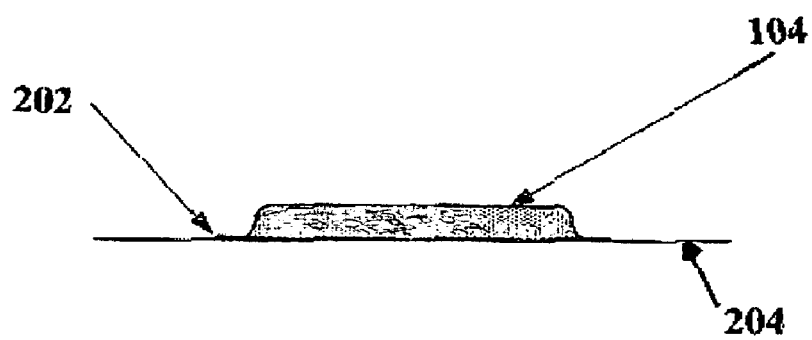
FIG. 2 shows a side view of the TID of FIG. 1 in accordance with an embodiment of the invention.

In FIG. 2, there is shown a side view of the TID 100. The side view provides a better view of the deformable pocket 104 that is filled with the mixture of diamond dust and solvent. As previously mentioned, pocket 104 can be hermetically sealed along the edge 202 that mates with base 102; this keeps the diamond dust/solvent mixture inside of the pocket or cup 104. Filling the pocket 104 with the proper amount of diamond dust and solvent mixture allows the top of the silver foil cup to fully deform onto individual DUTs (device-under-test, for example a semiconductor device) when pressed against a DUT with significantly less engagement force than required for indium and other prior art designs and yet have comparable or better overall thermal resistance due to the superior heat conduction properties of the diamond mixture and silver foil. The backside 204 of the silver foil base member 102 Is preferably coated with adhesive so that the TID 100 can be mounted onto as an example a test system evaporator or other heat exchange or heat transfer device.

Figure 3:
FIG. 3 shows a typical application of the use of a TID in accordance with an embodiment of the invention.

In one application as shown In FIG. 3, a thermal energy removal system comprising the TID 100 attached to a test system cooling evaporator 302 such as one disclosed in a U.S. Patent application having Ser. No. 11/451,036 entitled "Evaporator" by Cruzan et al. and incorporated herein by reference. The evaporator 302 and TID 100 are automatically presented against a DUT 304 such as a bare-die semiconductor during testing by a conventional automatic test system equipment (not shown). The test system's evaporator 301 along with the TID 100 can be automatically pressed against the DUT 304 by the automatic test system. When pressed against the DUT 304, the TID 100 will conform to the contour of the DUT's surface allowing for improved heat or thermal energy transfer allowing for any heat generated by the DUT 304 to be transferred away from the DUT 304 and to the evaporator 302.

The TID 100 as described herein provides for low thermal resistance between the DUT 304 and evaporator 302 thereby allowing for improved removal of heat from the DUT 304 during testing. By improving the amount of heat that can be removed from the DUT 304 allows for better test performance since the DUT 304 can be tested for longer periods without having to worry about damaging the DUT 304.

In other embodiments, the concept disclosed can be extended to forming a compliant TID that is more planar in shape and that is formed by for example the mixing of rubber, diamond dust and a solvent and possibly silver to form a compliant TID having high thermal conductivity.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A thermal interface device, comprising:
   a base member;
   a pocket member coupled to the base member;
   the pocket member is filled with a thermally conductive material; and the pocket member is hermetically sealed to the base member and the base member and pocket member are formed from silver foil.

2. A thermal interface device as defined in claim 1, wherein the thermally conductive material comprises diamond dust mixed with a solvent.

3. A thermal interface device as defined in claim 1, wherein the base member and pocket member are soldered together.

4. A thermal interface device as defined in claim 1, wherein the pocket member is deformable.

5. A thermal interface device as defined in claim 1, wherein the pocket member comprises a silver foil having a cupped section for storing the thermally conductive material.

6. A thermal interface device, comprising:
   a base member;
   a pocket member coupled to the base member;
   the pocket member is filled with a thermally conductive material; and
   A the thermally conductive material comprises nano-particle sized diamond dust in a propylene glycol solvent.

7. A thermal interface device as defined in claim 6, wherein the base member and pocket member are formed from silver foil.

8. A thermal interface device as defined in claim 6, wherein the pocket member has a substantially circular shape.

9. A thermal interface device as defined in claim 6, wherein the thermally conductive material further comprises rubber particles.

10. A thermal interface device, comprising
    a first silver foil member;
    a second silver foil member;
    the first and second silver foil members form a compressible sealed pocket; and
    a thermally conductive mixture is located inside of the sealed pocket which is sealed to prevent the thermally conductive mixture from leaving the sealed pocket.

11. A thermal interface device as defined in claim 10, wherein the thermally conductive mixture includes diamond dust and a liquid solvent.

12. A thermal interface device, comprising
    a first silver foil member;
    a second silver foil member;
    the first and second silver foil members form a sealed pocket;
    a thermally conductive mixture is located inside of the sealed pocket; and wherein the thermally conductive mixture includes diamond dust, a solvent and rubber particles.

13. A thermal interface device as defined in claim 12, wherein the sealed pocket is filled with enough thermally conductive mixture to allow it to deform when pressed against an object.

14. A thermal interface device as defined in claim 13, wherein the first and second silver foil members are soldered together to form the sealed pocket.

15. A thermal interface device; comprising:
    a deformable pillow; and
    a thermally conductive medium including a liquid located inside of the deformable pillow, the deformable pillow is sealed to prevent the liquid from escaping.

16. A thermal interface device as defined in claim 15, wherein the deformable pillow is formed from two sheets of thermally conductive foil.

17. A thermal interface device as defined in claim 15, wherein the thermally conductive medium is formed from a mixture of diamond dust suspended in a solvent.

18. A thermal interface device, comprising:
    a thermally conductive compressible member;
    thermally conductive material covering the thermally conductive compressible member; and wherein the thermally conductive compressible member comprises a thermally conductive rubber member.

19. A thermal interface device as defined in claim 18, wherein the thermally conductive material further comprises thermally conductive foil.

* * * * *